`US011640838B2`

United States Patent
Pallerla et al.

(10) Patent No.: US 11,640,838 B2
(45) Date of Patent: May 2, 2023

(54) PSEUDO-DUAL-PORT SRAM WITH BURST-MODE ADDRESS COMPARATOR

(71) Applicant: QUALCOMM Incorporated, San Diego, CA (US)

(72) Inventors: Arun Babu Pallerla, San Diego, CA (US); Changho Jung, San Diego, CA (US); Chulmin Jung, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 89 days.

(21) Appl. No.: 17/448,846

(22) Filed: Sep. 24, 2021

(65) Prior Publication Data

US 2023/0093852 A1     Mar. 30, 2023

(51) Int. Cl.
| | | |
|---|---|---|
| G11C 11/418 | (2006.01) | |
| G11C 7/22 | (2006.01) | |
| G11C 7/10 | (2006.01) | |
| H03K 19/21 | (2006.01) | |
| G11C 7/06 | (2006.01) | |
| G11C 5/14 | (2006.01) | |

(52) U.S. Cl.
CPC .............. *G11C 7/222* (2013.01); *G11C 5/14* (2013.01); *G11C 7/062* (2013.01); *G11C 7/106* (2013.01); *G11C 7/1087* (2013.01); *H03K 19/21* (2013.01)

(58) Field of Classification Search
CPC .......... G11C 7/222; G11C 5/14; G11C 7/062; G11C 7/106; G11C 7/1087; H03K 19/21
USPC ..................................... 365/233.1
See application file for complete search history.

(56) References Cited

U.S. PATENT DOCUMENTS

| | | | |
|---|---|---|---|
| 5,652,723 A | 7/1997 | Dosaka et al. | |
| 10,510,402 B2 | 12/2019 | Siddiqui et al. | |
| 10,659,083 B1* | 5/2020 | Old | H03M 13/3746 |
| 10,715,165 B2* | 7/2020 | Kurahashi | H03M 1/38 |
| 10,770,132 B1* | 9/2020 | Jung | G11C 7/065 |
| 11,024,347 B2 | 6/2021 | Bringivijayaraghavan et al. | |
| 2002/0071332 A1 | 6/2002 | Nishiyama et al. | |
| 2011/0261615 A1* | 10/2011 | Choi | G11C 13/0004 365/163 |
| 2016/0055903 A1 | 2/2016 | Yoon et al. | |
| 2020/0327932 A1 | 10/2020 | Verma et al. | |
| 2021/0134358 A1 | 5/2021 | Jung et al. | |

FOREIGN PATENT DOCUMENTS

WO        2021021507 A1      2/2021

OTHER PUBLICATIONS

International Search Report and Written Opinion—PCT/US2022/042967—ISA/EPO—dated Nov. 23, 2022.

* cited by examiner

*Primary Examiner* — Huan Hoang
*Assistant Examiner* — Minh Dinh
(74) *Attorney, Agent, or Firm* — Haynes and Boone, LLP (57) ABSTRACT

A memory is provided that is configured to practice two different modes of read operation, such as both a normal read operation and a burst-mode read operation. In one example, the memory is a pseudo-dual-port memory. The memory may include an address comparator to perform a time-division multiplexing to first compare a read address to a stored address and then to compare a write address to the stored address.

29 Claims, 6 Drawing Sheets

PSEUDO-DUAL-PORT SRAM WITH BURST-MODE ADDRESS COMPARATOR

TECHNICAL FIELD

This application relates to memories, and more particularly to a pseudo-dual-port SRAM with a burst-mode address comparator.

BACKGROUND

The bitcells in a static random-access memory (SRAM) are arranged into rows and columns A row is accessed by asserting the voltage of the corresponding row word line. With the word line for a row asserted, a sense amplifier for a column of bitcells that intersects the asserted row may make a bit decision. Each column has a bit line pair formed by a bit line and a complement bit line. Before the read operation, the bit line pair is pre-charged. With the word line to the accessed row asserted, one of the bit lines in the bit line pair will begin discharging depending upon the binary value of a stored bit in a bitcell at the intersection of the accessed row and column Power is thus consumed for a normal read operation by the pre-charging and discharging of the bit lines and also the power consumed by the ensuing sense amplifier operation. This normal read operation may also be denoted herein as a random read operation to distinguish it from a burst-mode read operation.

If each sense amplifier may latch its bit decision, an SRAM may also have a burst-mode read operation. For example, suppose a random read operation occurs to a row. Each sense amplifier coupled to a column of bitcells traversed by the row may then sense and latch a bit decision. If another read operation occurs to the same row before a write operation occurs to the row, the SRAM may invoke a burst-mode read operation instead of a random read operation. In the burst-mode read operation, the word line is not asserted nor are any of the bit lines discharged. Similarly, there is no power consumed by a sense amplifier operation in a burst-mode read operation. Substantial power is thus conserved by the use of a burst mode.

SUMMARY

In accordance with an aspect of the disclosure, an address comparator for a memory is provided that includes: a plurality of single-bit comparators, each single-bit comparator in the plurality of single-bit comparators including a multiplexer configured to select for a read address bit during a memory read operation to provide a selected bit and to select for a write address bit during a memory write operation to provide the selected bit and including a first logic gate configured to compare the selected bit to a stored address bit to provide an output signal; and a combining circuit configured to combine the output signal from each single-bit comparator in the plurality of single-bit comparators to form a combined output signal to control the memory read operation.

In accordance with another aspect of the disclosure, a burst-mode address comparison method for a PDP memory is provided that includes: resetting a burst-mode blocking latch responsive to a completion of a first random read operation during a first memory clock cycle to put the burst-mode blocking latch into a reset state; during a first write operation in the first memory clock cycle, maintaining the reset state of the burst-mode blocking latch responsive to a first address comparison indicating that the first write operation is not directed to a bitcell group that was addressed in the first random read operation; following a completion of the first write operation during the first memory clock cycle, asserting a burst-mode enable signal to provide an asserted burst-mode enable signal responsive both to a second address comparison indicating that a read address for a second memory clock cycle is directed to a bitcell in the bitcell group and responsive to the burst-mode blocking latch being maintained in the reset state; and during the second memory clock cycle, performing a burst-mode read operation to the bitcell in the bitcell group responsive to the asserted burst-mode enable signal.

In accordance with yet another aspect of the disclosure, an address comparator for memory is provided that includes: a plurality of one-bit address comparators having a plurality of output terminals, each one-bit address comparator in the plurality of one-bit address comparators including a multiplexer coupled to a respective read address input terminal and to a respective write address input terminal; and a combining circuit configured to combine an output signal from each single-bit comparator in the plurality of single-bit comparators to form a combined output signal on a combined output signal terminal.

Finally, in accordance with another aspect of the disclosure, a burst-mode address comparator for a pseudo-dual-port (PDP) memory is provided that includes: an address memory configured to store an address for a bitcell group to provide a stored address; an address multiplexer configured to select to select between a read address for a PDP read operation and a write address for a PDP write operation to provide a selected address; a plurality of first logic gates configured to assert a bit comparison signal responsive to the selected address being equal to the stored address; a pulsed latch configured to assert a burst-mode signal responsive to an assertion of the bit comparison word while a burst reset signal is in a reset state; and a burst-mode blocking latch configured to set the burst reset signal responsive to an assertion of the bit comparison word during the PDP write operation and to reset the burst reset signal into the reset state after a completion of the PDP read operation.

These and additional advantageous features may be better appreciated through the following detailed description.

Implementations of the present disclosure and their advantages are best understood by referring to the detailed description that follows. It should be appreciated that like

DETAILED DESCRIPTION

A conventional SRAM bitcell includes a pair of cross-coupled inverters formed by four transistors for latching a bit. A pair of access transistors forms a single access port for both read and write operations so that the total number of transistors to construct a single-port SRAM bitcell is six transistors. To provide greater operating bandwidth and flexibility, the six-transistor bitcell may be modified to include another pair of access transistors. The resulting dual-port bitcell thus has eight transistors. But these extra transistors occupy die space in the resulting integrated circuit. Pseudo-dual-port (PDP) six-transistor bitcells have thus been developed that emulate two access ports with just a single access port. Whereas it is traditional to dedicate a single memory clock cycle to just one memory access operation (either read or write) for a single-port six-transistor bitcell, a PDP bitcell is "double-pumped" such that a read operation and then a write operation may be accomplished in just one memory clock cycle. A PDP SRAM thus offers the flexibility of a traditional dual-port SRAM yet advantageously provides the density of traditional six-transistor bitcell architectures.

Although PDP SRAMs are thus advantageous, existing address comparators for invoking burst-mode operation in SRAMs are not compatible with the double-pumped timing of PDP operation. A burst-mode address comparator is thus disclosed that is compatible with PDP operation. To better appreciate the advantageous features of the resulting PDP SRAM with burst-mode capability, some background concepts for PDP operation will first be discussed.

The bitcells for a PDP SRAM are arranged into rows and columns. Each row is accessed by asserting a voltage of a corresponding word line. Each column includes a pair of bit lines that are pre-charged prior to a read operation. With the word line asserted, a bitcell will begin to develop a voltage difference across the bit line pair in the corresponding column. A PDP SRAM may be classified according to how many bitcell columns are multiplexed to a global output during a read operation. For example, if four columns are multiplexed to every global output latch, the PDP SRAM may be denoted as a "MUX4" memory. A burst mode may then be further classified with regard to the number of sense amplifiers that may sense bit decisions for each multiplexed group of columns. For example, in a MUX4 PDP SRAM, a first sense amplifier may be multiplexed to a first pair of the columns whereas a second sense amplifier may be multiplexed to a second pair of the columns. The burst mode for such a MUX4 PDP SRAM may be denoted as a two-bit burst mode because the two sense amplifiers latch two sensed bits that may be read during burst-mode operation. Although power is thus saved, note that there are four bitcells in any given row in a group of four multiplexed columns. If there are just two sense amplifiers, then a pair of the bitcells are not sensed during any given sense operation. Should a burst-mode read have been triggered to one of the bitcells in the sensed pair, a subsequent read operation to one of the bitcells in the remaining pair of bitcells cannot occur as a burst-mode read operation.

It thus may be more advantageous for every column of bitcells to have their own sense amplifier in a burst-mode read operation. For example, the burst mode for a MUX4 PDP SRAM in which every column has a sense amplifier may be denoted as a four-bit burst mode because the four sense amplifiers latch four bits from the corresponding group of four columns. But high-density SRAMs have a relatively narrow pitch between columns A traditional SRAM sense amplifier has difficulty fitting within such a narrow pitch so that a four-bit burst-mode SRAM is not practical. In particular, note that during a random read (non-burst-mode) operation, the voltage difference across the bit line pair is not full rail but instead equals a fraction of the voltage supply. For example, if the power supply voltage is one volt, the bit line voltage difference may be just 100 millivolts or less. To respond to this relatively-small voltage difference and successfully make a bit decision, a conventional sense amplifier needs to provide a relatively-large amount of gain. Such a high-gain sense amplifier does not fit within the column pitch. A four-bit burst-mode read operation is thus not available for traditional SRAM architectures. More generally, a burst-mode read operation is not typically suitable for an SRAM in which every column in a group of multiplexed columns includes a sense amplifier.

To enhance the burst-mode operation, a charge-transfer PDP SRAM is disclosed herein in which each column may have an individual sense amplifier. However, it will be appreciated that the burst-mode address comparator for PDP operation that is disclosed herein is widely suitable for burst-mode architectures in which each sense amplifier is multiplexed to two or more columns. The following discussion of charge-transfer operation is thus provided without loss of generality. As will be explained further herein, a charge-transfer burst-mode PDP SRAM uses a pair of cross-coupled logic gates as a sense amplifier. Such a relatively simple sense amplifier may fit within the tight column pitch of a modern SRAM and thus allows each column to have its own sense amplifier.

Before a burst-mode read operation may occur to bitcells for an addressed row, a random read operation must first have been performed to that bitcell row. In a random read operation, the bit line pairs for the columns are pre-charged to a memory power supply voltage. A memory clock signal then triggers a clock circuit to assert a word line for the addressed row. The asserted word line switches on the access transistors in the row's bitcells so that the bitcells in the addressed row can affect the pre-charged state of the corresponding bit line pairs. Depending upon the binary content of the addressed bitcells, one of the bit lines in each bit line pair will be discharged slightly below the memory power supply voltage while a second bit line in each bit line pair remains charged to the memory power supply voltage.

Each column may have its own sense amplifier that latches a bit decision based upon the voltage difference developed across the column's bit line pair when the word line voltage is asserted. As discussed previously, a group of multiplexed columns share a global output latch. A bit decision from the latched bit decisions in a multiplexed column group is thus selected by a column multiplexer to be latched in the global output latch. The bitcells at the intersection of a word line with the group of multiplexed columns that were latched by the group's sense amplifiers are denoted herein as a bitcell group such that only the column address differs across the bitcell group.

In a two-bit burst-mode PDP MUX4 architecture, the bitcell group would thus be two bitcells out of the four possible bitcells since there are only two sense amplifiers per group of four multiplexed columns in such an implementation. In a four-bit burst-mode PDP MUX4 architecture, the bitcell group would be all four bitcells of a row since each column has its own sense amplifier in that case. Each group of multiplexed columns includes a column multiplexer that selects from the group's sense amplifiers to drive a corresponding global output latch with a selected bit decision. The selection by the column multiplexer depends upon the column address. Each sense amplifier includes a pair of sense amplifier nodes for coupling to the column's bit lines during a sense enable period in a random read operation. This coupling occurs through a pair of charge-transfer transistors. The sense amplifier nodes are precharged prior to the random read operation although this pre-charging may be a discharge to ground as compared to the pre-charging of the bit lines to the power supply voltage. The random read operation ends with the bit decision from the addressed column being latched in the data output latch. As used herein, the term "latch" refers to any storage element includes a pair of cross-coupled logic gates (e.g., cross-coupled inverters) configured to store a binary signal. For example, a flip-flop, a set-reset latch, and a pulsed latch would all be examples of a "latch" as that term is used herein.

Whether a consecutive read operation is another random read operation or a burst-mode read operation depends in part upon whether the address for the consecutive read operation is directed to the same bitcell group. Note that during the random read operation, each sense amplifier in the addressed group of multiplexed columns latched a bit decision for the bitcell group. A burst-mode address comparator disclosed herein advantageously invokes the burst mode for the consecutive read operation if the same bitcell group is addressed as was addressed in the preceding read operation so long as no intervening write operations occur to the same bitcell group. In this fashion, the latched bit decisions from the preceding read operation are utilized in a current burst-mode read operation without requiring the word line to be re-asserted and despite a presence of write operations to other rows. Similarly, the bit lines are not discharged nor are the sense amplifier nodes pre-charged during a burst-mode read operation so as to reduce power consumption.

Prior to the burst-mode address comparator invoking the burst mode, a random read operation should occur so that the sense amplifiers latch their bit decisions. Once the random read operation occurs, the burst mode may be invoked again and again so long as the same bitcell group is being addressed as was addressed in the preceding read operation (assuming that there is no intervening write to the addressed bitcell group). For example, suppose that four columns are multiplexed and that an initial random read operation occurs to a first column from the four columns in a PDP four-bit burst-mode MUX4 SRAM. If a consecutive read operation is directed to the same row without any intervening write operation to the same row, the PDP burst-mode address comparator activates the burst mode. In this fashion, a second column from the four columns may be read in a first burst-mode read operation. A third column from the four columns may then be read in a second burst-mode read operation, and so on. The word line, the bit lines, and the sense amplifier nodes are not toggled (their voltages stay constant) during the burst-mode read operations, which substantially reduces power consumption.

Because a PDP is "double pumped" such that both a read operation and a write operation occur in one memory clock cycle, a PDP burst-mode address comparator performs two address comparisons per memory clock cycle. The following discussion will assume that the read operation occurs before the write operation, but it will be appreciated that the disclosed PDP burst-mode address comparison may be used regardless of whether the read or the write operation occurs first. Each address comparison determines whether a current read or write address is directed to the same bitcell group as was addressed in a preceding read operation (either random or burst mode). If a current write address is directed to this same bitcell group, then a subsequent read operation is forced to be a random read operation, even if the subsequent read operation is directed to the same bitcell group. Such a write operation may be denoted as an intervening write operation since it intervenes between the two random read operations. Conversely, if there is no intervening write operation and the current read operation is directed to the same bitcell group as was accessed in the preceding read operation (either random or burst mode), the PDP burst-mode address comparator invokes a burst-mode for the current read operation.

The following discussion will be directed to advantageous charge-transfer implementations for a PDP burst-mode memory. However, it will be appreciated that the PDP burst-mode address comparison disclosed herein is applicable to any SRAM in which each column for a bitcell group includes a latching sense amplifier. In a charge-transfer memory implementation, density need not be hindered by a lack of multiplexing a single sense amplifier across multiple columns because of a charge-transfer operation that is achieved through the control of charge-transfer transistors. Each bit line for a column couples to a sense amplifier node for the column's sense amplifier through a corresponding charge-transfer transistor. A source of each charge-transfer transistor couples to its bit line whereas a drain of each charge-transfer transistor couples to its sense amplifier node. The gate-to-source voltage for each charge-transfer transistor is thus determined by its gate voltage and its bit line voltage. The following discussion will assume that each charge-transfer transistor is a p-type metal-oxide semiconductor (PMOS) transistor but it will be appreciated that charge transfer may also be accomplished with n-type metal-oxide semiconductor (NMOS) transistors.

The charge-transfer technique discussed herein results in an amplification of the bit line voltage difference across the pair of sense nodes for a bit line pair. Due to this amplification, a resulting sense amplifier does not need high gain but instead may be implemented by a reset-set (RS) latch that is relatively dense and has a relatively low power consumption. Each column may thus have its own sense amplifier. An N-bit burst mode for a PDP SRAM in which the column group size is N columns (N being a plural positive integer) may thus be implemented.

The charge transfer occurs during a charge-transfer period that begins near an end of the word line assertion period for a random read operation. Prior to the charge-transfer period, the gate voltage for each charge-transfer transistor is maintained at the power supply voltage so that each charge-transfer transistor is off. The charge-transfer period is delayed with respect to the assertion of the word line so that the bit line voltage difference may develop for each bit line pair. During the charge-transfer period, the gate voltage for the charge-transfer transistors is dropped from the power supply voltage at some slew rate towards ground. For example, a relatively small inverter or the dummy bit line voltage may be used to control the gate voltage for the charge-transfer transistors. Depending upon the bit value being read, either the true bit line or the complement bit line in each bit line pair will drop slightly from its pre-charged state (the power supply voltage). This bit line is referred to in the following discussion as the partially-charged bit line. But the remaining bit line in each bit line pair will remain charged to the power supply voltage. This bit line is referred to as the fully-charged bit line in the following discussion.

The gate voltage for each charge-transfer transistor in the group of multiplexed columns is dropped during the charge-transfer period so that the gate-to-source voltage (the gate-to-bit-line voltage) for the charge-transfer transistor for the fully-charged bit line satisfies its threshold voltage. But the reduction in voltage for the partially-charged bit line is such that this same gate voltage does not satisfy the threshold voltage for the charge-transfer transistor coupled to the partially-charged bit line. Thus, only the charge-transfer transistor for the fully-charged bit line in a bit line pair will initially conduct charge to its sense node. The capacitance of the sense node may be relatively small compared to the capacitance of the bit line so the resulting charge transfer causes the sense node to be charged (or be very close to being charged) to the power supply voltage. In contrast, the sense node for the partially-discharged bit line remains in its discharged default state such that the voltage difference between the sense nodes for an accessed bit line pair is substantially full rail (a voltage difference substantially equaling the power supply voltage). The charge transfer has thus resulted in an amplification of the relatively minor bit line voltage difference into a nearly-full-rail voltage difference on the sense nodes such that the sense amplifier may be a relatively compact and low-power reset-set (RS) latch such as formed by a pair of cross-coupled NAND gates. The sensing by the sense amplifier occurs in a sense enable period.

Figure 1:
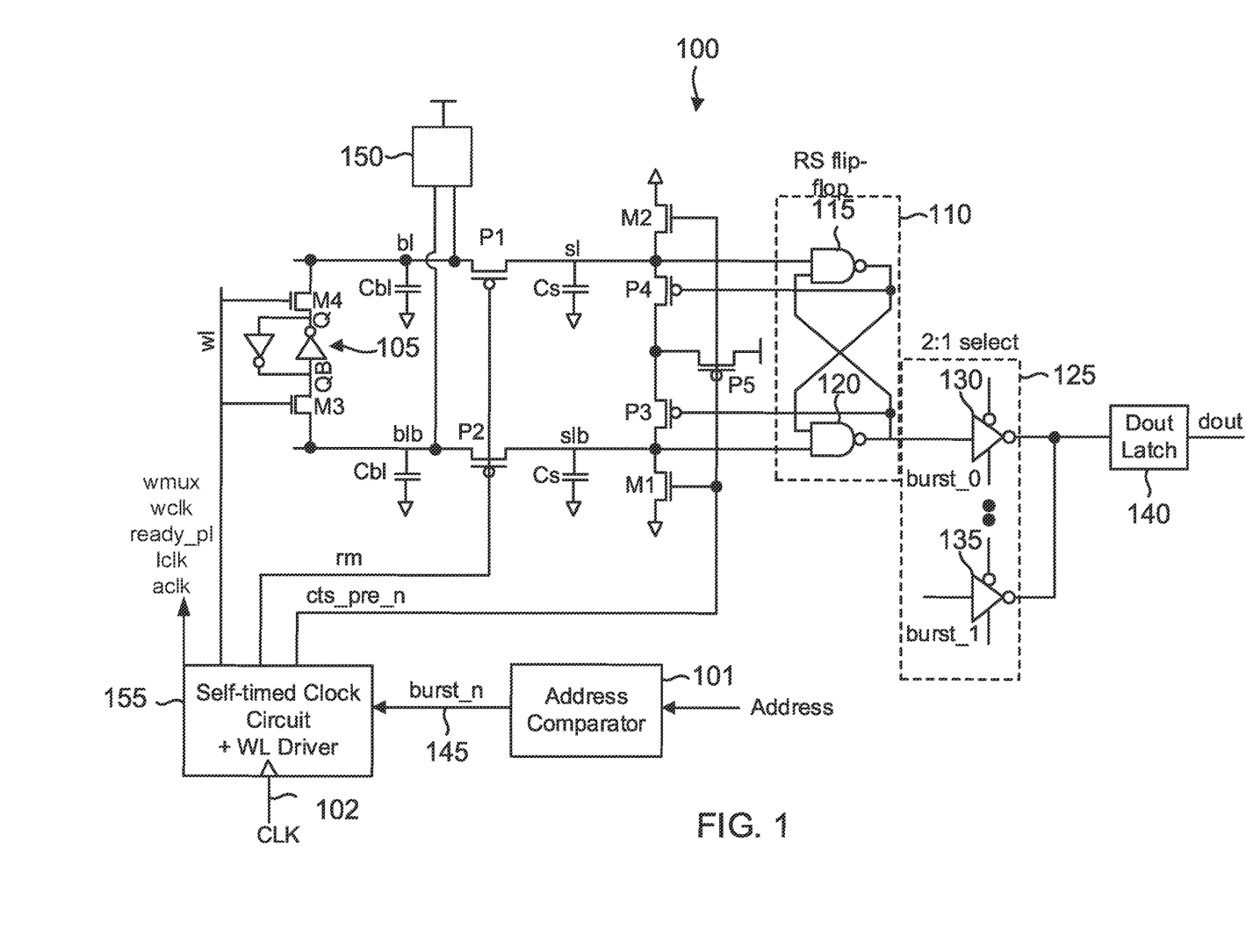
FIG. 1 illustrates a PDP SRAM including a burst-mode address comparator for invoking a burst mode of operation in accordance with an aspect of the disclosure.

An example PDP charge-transfer SRAM 100 is shown in FIG. 1 that includes a burst-mode address comparator 101 that advantageously invokes the burst mode despite the PDP operation. A bit line pair formed by a bit line bl and a complement bit line blb traverse a first column. A bitcell 105 lies at an intersection of the first column and a word line wl. Bitcell 105 includes a pair of cross-coupled inverters. The output node of a first one of the inverters is the true (Q) output for bitcell 105. This output node couples to the bit line bl through an NMOS access transistor M4 in bitcell 105. Similarly, bitcell 105 also includes a remaining second one of the inverters having a complement (QB) output node. Bitcell 105 includes an NMOS output transistor M3 that couples between the complement QB output node and the complement bit line blb. The word line wl couples to the gates of the access transistors so that the Q and QB nodes drive their respective bit lines during a word line assertion period.

SRAM 100 includes additional columns such as a second column having a bitcell at the second column's intersection with word line wl. Since the second column is a repeat of the structure in the first column, the details for the second column are not shown in FIG. 1 for illustration clarity. The two columns are multiplexed through a column multiplexer 125 to a global output latch 140. Should a read operation (whether random or burst mode) be directed to bitcell 105, column multiplexer 125 selects for a sense amplifier output from a sense amplifier 110 for the first column. For example, column multiplexer 125 may include a tri-state buffer 130 for the first column and a tri-state buffer 135 for the second column. The tri-state buffer for the un-selected column is tri-stated to form the selection in column multiplexer 125. The output of column multiplexer 125 is latched in global output latch 140. Should PDP SRAM 100 be a MUX4 SRAM, column multiplexer 125 selects between four columns More generally, column multiplexer 125 may select from a group of N multiplexed columns.

Bitcell 105 for the first column and the corresponding bitcell in the second column form a bitcell group that share a common address that identifies word line wl and the group of multiplexed columns Only the column address changes within the bitcell group. A row address is common to the bitcell group since a bitcell group will always be formed in a common row. Regardless of whether a read operation occurs with or without the burst mode, each read operation is responsive to a cycle of a memory clock signal 102. Suppose that a first memory clock cycle corresponds to a read operation involving a different word line and/or column and that this first memory clock cycle is followed by a second memory clock cycle in which a read operation is directed to bitcell 105. For this second read operation, burst-mode address comparator 101 does not activate the burst mode since the previous address decoded in the first memory clock cycle identified a different word line and/or a different group of multiplexed columns.

Prior to the word line assertion during a random read operation, bit lines bl and blb were pre-charged to the power supply voltage by a bit line pre-charge circuit 150. Such pre-charging of the bit lines is conventional and thus the details for bit line pre-charge circuit 150 are not illustrated in FIG. 1. The timing of various actions such as the pre-charging of the bit lines, the pulse width for the word line assertion, and the enabling of sense amplifier 110 during a read operation is controlled by a clock circuit 155 as triggered by memory clock signal 102. The timing of these actions during a normal read operation is self-timed. For example, SRAM 100 may include a dummy word line (not illustrated) as well as a dummy bit line (not illustrated). The dummy word line mimics the electrical behavior of the word line. Similarly, the dummy bit line mimics the electrical behavior of the bit line. When clock circuit 155 asserts the word line voltage, the dummy word line is also charged. Once the dummy word line develops a sufficient charge, it triggers a toggling (either a charge or discharge) of the dummy bit line voltage. In response to the dummy bit line toggling, clock circuit 155 releases the word line assertion and enables sense amplifier 110. Such self-timing by SRAM 100 is conventional. However, clock circuit 155 is modified from such conventional function to accommodate the burst mode. Clock circuit 155 is thus responsive to a burst-mode signal such as an active-low burst-mode signal (burst_n) carried on a node 145 so that the word line is not asserted, the bit lines are not pre-charged, and the charge-transfer transistors P1 and P2 are not switched on during a burst-mode read operation. The burst-mode signal burst_n may also be denoted herein as a read control signal since it controls whether the burst-mode is active or not for a read operation. Clock circuit 155 has an input terminal coupled to node 145 so as to receive the burst-mode signal. As will be explained further herein, clock circuit 155 generates a write multiplexer (wmux) signal, a write clock (wclk), a ready_pl signal, an iclk signal, and an aclk signal.

To control whether the burst mode is active, burst-mode address comparator 101 asserts or de-asserts the burst-mode signal. As used herein, a signal is said to be "asserted" (or equivalently "set") when the signal has a logical true state, regardless of whether the logical true state is active high or active low. Conversely, a signal is deemed herein to be "reset" when the signal has a logical false state, regardless of whether the logic true state is active high or active low. In alternative implementations, the burst-mode signal may instead be an active high signal. In its default state, the burst-mode signal is not asserted. Burst-mode address comparator 101 asserts the burst-mode signal only when the conditions for a burst-mode read operation are satisfied. Should burst-mode address comparator 101 not assert the burst-mode signal, PDP SRAM 100 implements a random read operation in which a cycle of memory clock signal 102 triggers a word line assertion (a charging of the voltage for word line wl) by clock circuit 155. Prior to this word line assertion, bit lines bl and blb were pre-charged to the power supply voltage by bit line pre-charge circuit 150. Following the bit line pre-charging, bit line pre-charge circuit 150 floats the bit lines. Bit line bl couples to a corresponding sense node sl for sense amplifier 110 through a PMOS charge-transfer transistor P1. Similarly, complement bit line blb couples to a corresponding sense node slb of sense amplifier 110 through a PMOS charge-transfer transistor P2. Prior to the word line assertion, a gate voltage rm for the charge-transfer transistors P1 and P2 is charged to the power supply voltage by clock circuit 155 to prevent any charge transfer to the sense nodes. Since the burst mode is not active, clock circuit 155 charges a sense node pre-charge signal (cts_pre_n) to a power supply voltage prior to the word line assertion. The charged sense node pre-charge signal drives the gates of an NMOS sense-node transistor M1 and an NMOS sense-node transistor M2. The sources of sense-node transistors M1 and M2 are tied to ground whereas their drains are tied to complement sense node slb and sense node sl, respectively. The assertion of the sense node pre-charge signal cts_pre_n will thus discharge both the sense node sl and the sense node slb for the first column since both sense-node transistors M1 and M2 are switched on to couple their respective sense nodes to ground. As noted earlier, the second column has the same structure as shown for the first column.

Both columns will thus have their sense nodes discharged and their bit lines pre-charged prior to the word line assertion for a random read operation. But if a consecutive read operation is directed to the second column without an intervening write operation to the same bitcell group, burst-mode address comparator 101 activates the burst mode by asserting the burst-mode signal (recall that the burst-mode signal is active-low such that it is asserted by being discharged). Clock circuit 155 responds to the assertion of the burst-mode signal by preventing or blocking the assertion of the word line wl. Similarly, the gate voltage signal rm is maintained at a power supply voltage by clock circuit 155 during a burst-mode read operation to prevent the charge-transfer transistors P1 and P2 from conducting. In addition, clock circuit 155 maintains the sense amplifier precharge signal cts_pre_n at ground during the burst-mode read operation to prevent the pre-charging of the sense nodes sl and slb.

During a random read operation, the switching on of the access transistors M4 and M3 by the assertion of the word line voltage causes one of the bit line bl or blb to discharge slightly from its pre-charged state depending upon the binary content stored in bitcell 105. This slight bit line discharge is amplified by the charge-transfer period during which charge-transfer transistors P1 and P2 are switched on as follows. The charge-transfer period is triggered by the discharge of gate voltage rm. This discharge of the gate voltage rm begins while the word line voltage is still asserted. The discharge of the gate voltage rm may end after the word line voltage has been discharged. The discharge of the gate voltage rm has some slope or slew rate to it. Due to this less-than-instantaneous discharge of the gate voltage rm, the gate voltage rm will discharge to an intermediate voltage before being fully discharged to ground. This intermediate voltage satisfies the threshold voltage for the charge-transfer transistor having its source tied to the fully-charged bit line but will still be above the threshold voltage for the charge-transfer transistor having its source tied to the partially-discharged bit line. The charge-transfer transistor for the fully-charged bit line will thus conduct charge to its sense node prior to when the other charge-transfer transistor conducts charge from the partially-discharged bit line. For example, suppose that bit line bl is the fully-charged bit line such that charge-transfer transistor P1 begins conducting before charge-transfer transistor P2. The voltage of the sense node sl will thus increase prior to the increase of the voltage of the complement sense node slb.

Sense node sl is connected to an input of a NAND gate 115 in sense amplifier 110. Similarly, sense node slb ties to an input of a NAND gate 120 in sense amplifier 110. NAND gates 115 and 120 are cross-coupled to form an RS latch. The pre-charging to zero volts of the sense nodes causes both outputs of NAND gates 115 and 120 to be asserted high to the power supply voltage. The output of NAND gate 120 also forms an output terminal for sense amplifier 110. A corresponding NAND gate in the second column (not illustrated) forms an output terminal for the second column's sense amplifier. The capacitance of the sense nodes as conceptually represented by capacitors Cs is relatively small as compared to the bit line capacitance as conceptually represented by capacitors Cbl. The brief amount of time in which charge-transfer transistor P1 begins conducting before charge-transfer transistor P2 conducts thus causes a significant increase in the voltage of sense node sl as compared to sense node slb. This increase in voltage exceeds the threshold voltage for NAND gate 115 such that its output is discharged to zero. The zero output of NAND gate 115 reinforces the binary high output of NAND gate 120 so that the binary one value stored in bitcell 105 is latched in sense amplifier 110.

If the read operation is to the first column, column multiplexer 125 selects for the output terminal of sense amplifier 110 in the first column so that the binary content of bitcell 105 is latched into global output latch 140 in the first memory cycle. But note that the sense amplifier for the second column has also latched a bit from the second column's bitcell. This sensed bit will not be discarded if a consecutive read operation is directed to this bitcell without the presence of any intervening write operations to the same bitcell group. PDP burst-mode address comparator 101 detects that the address for the second read operation is directed to the same bitcell group without any intervening write operation to the same bitcell group and thus triggers the burst mode for the second memory clock cycle by asserting the burst-mode signal. In response to the assertion of the burst-mode signal, clock circuit 155 prevents the charging of the word line wl voltage during the second memory clock cycle. Similarly, clock circuit 155 prevents the sense node pre-charge signal from being asserted during the second memory clock cycle. In addition, clock circuit 155 also prevents a discharge of the gate voltage rm during the second memory clock cycle due to the burst-mode operation. Column multiplexer 125 then selects for the second column through tri-state buffer 135 so that the bit from the second column's bitcell may be stored in global output latch 140.

It will be appreciated that PDP memory 100 includes a plurality of columns (not illustrated) constructed as discussed for the first column. Each of these additional columns has its own charge-transfer transistors P1 and P2 having their gate voltage rm controlled by memory clock circuit 155.

To assist the latching within sense amplifier 110, the sense node pre-charge signal drives a gate of a PMOS transistor P5 having its source tied to a power supply node for the power supply voltage. The drain of transistor P5 connects to the sources of a pair of PMOS transistors P4 and P3. The drain of transistor P4 is tied to the sense node sl whereas the drain of transistor P3 is tied to the complement sense node slb. The output of NAND gate 115 drives the gate of transistor P4. Similarly, the output of NAND gate 120 drives the gate of transistor P3. For example, suppose that the output of NAND gate 115 is low. This low output switches on transistor P4 to reinforce the fully-charged state of sense node sl, which in turn reinforces the zero output for NAND gate 115. Conversely, suppose that the output of NAND gate 120 is low following a sense enable period. Transistor P3 would then be switched on. The switching on of transistor P3 reinforces the fully-charged state of complement sense node slb, which in turn reinforces the zero output of NAND gate 120. In this fashion, the latching of the sensed bit in sense amplifier 110 is strengthened or reinforced.

Figure 2:
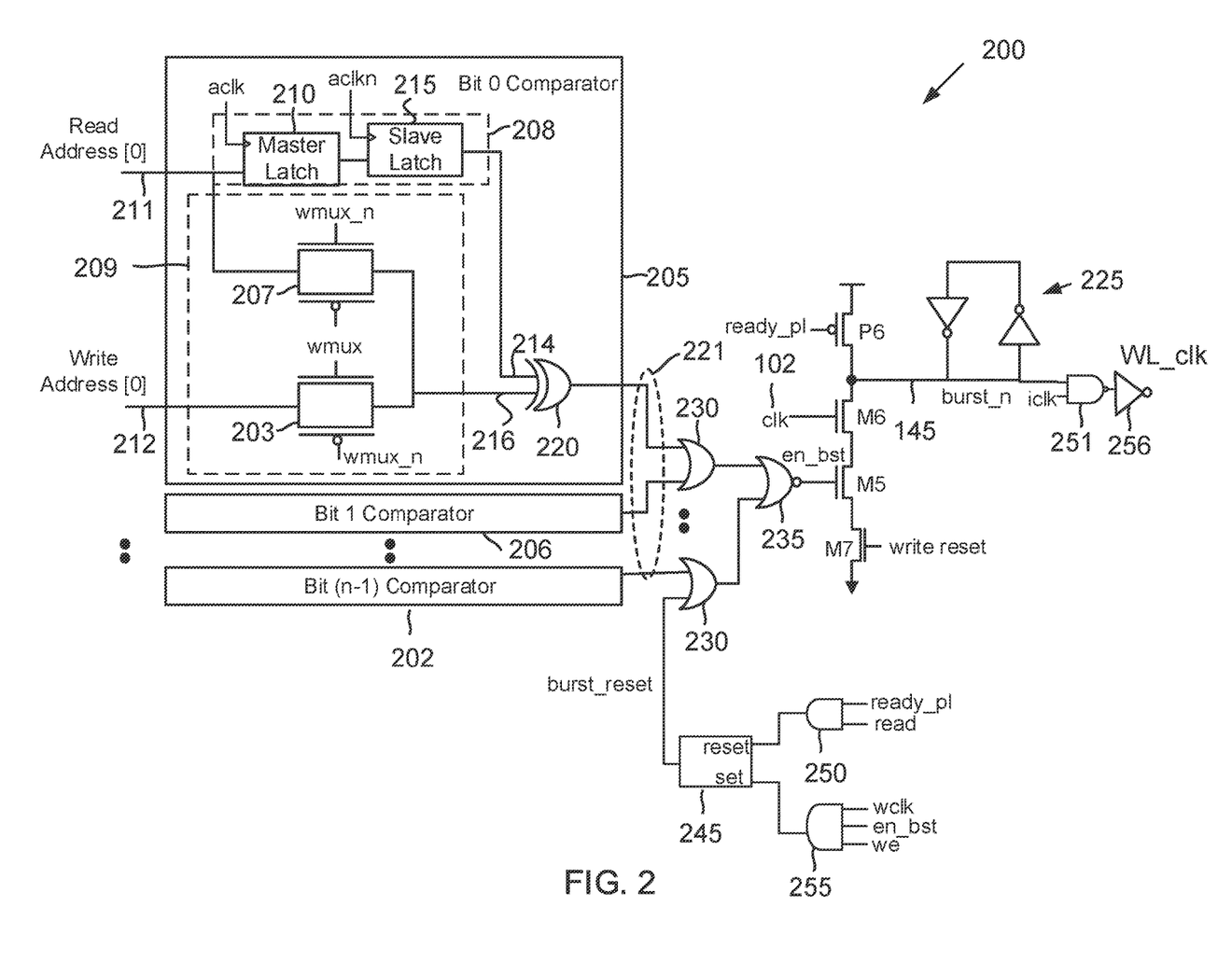
FIG. 2 illustrates an example PDP burst-mode address comparator in accordance with an aspect of the disclosure.

An example PDP burst-mode address comparator 200 is shown in more detail in FIG. 2 along with a portion of clock circuit 155 (a NAND gate 251 and an inverter 256). It will be appreciated that the burst-mode address comparison performed by burst-mode address comparator 200 is not limited to any particular column multiplexing size or dimension. An address that identifies a bitcell group in a group of multiplexed columns for a write or a read operation may thus be deemed to be an n-bit wide address, where n is a plural positive integer. These n address bits range from a zeroth address bit to an (n−1)th address bit. PDP burst-mode address comparator 200 includes a single-bit comparator for each address bit. There is thus a bit 0 comparator 205 for a zeroth address bit, a bit 1 comparator 206 for a first address bit, and so on such that a bit (n−1) comparator 202 is provided for a final (n−1)th address bit. Each single-bit comparator includes a logic gate that forms a one-bit output signal having a binary state that depends on the corresponding bit comparison. For example, bit 0 comparator 205 includes an XOR gate 220 for forming the corresponding one-bit output signal. Since there are n single-bit comparators for an n-bit-wide address, the one-bit output signals from the various XOR gates 220 form an n-bit-wide bit comparison signal 221. Other logic gates such as an XNOR gate for each single-bit comparator may be used in alternative implementations.

For illustration clarity, only bit 0 comparator 205 is shown in detail in FIG. 2 but it will be appreciated that the remaining single-bit comparators such as bit 1 comparator 206 and bit (n−1) comparator 202 are constructed analogously. The following discussion will thus focus on the details of bit 0 comparator 205 but analogous features are included in the each of the remaining one-bit comparators. Bit 0 comparator 205 includes a read address bit [0] input terminal 211 and a write address bit [0] input terminal 212. Read address bit [0] input terminal 211 couples to a corresponding first storage element such as a master-slave latch 208 formed by a master latch 210 and a slave latch 215. Master latch 210 is clocked by a memory operation clock (aclk) that is asserted by clock circuit 155 in response to the assertion of the memory clock signal 102. Slave latch 215 is clocked by a complement (aclkn) of the aclk signal. The delay through the master and slave latching is one read operation so that the address bit stored by slave latch 215 is the address bit from a preceding read operation. XOR gate 220 exclusively ORs the stored address bit from slave latch 215 and a selected bit selected by a multiplexer 209. Master-slave latch 208 couples between read address bit[0] input terminal 211 and a first input terminal 214 of XOR gate 220. Since there are n single-bit comparators in burst-mode address comparator 200, there are n multiplexers 209 (only a single multiplexer 209 is shown in FIG. 2 for illustration clarity). These n multiplexers may also be denoted herein as an address multiplexer.

Multiplexer 209 drives a second input terminal 216 of XOR gate 220. Multiplexer 209 includes a first switch such as a transmission gate 207 that couples between the read address bit [0] input terminal 211 and the second input terminal 216 of XOR gate 220. Similarly, multiplexer 209 includes a second switch such as a transmission gate 203 that couples between the write address bit [0] terminal 212 and the second input terminal 216. More generally, each one-bit comparator includes a read address bit input terminal and a write address bit input terminal. Similarly, each one-bit comparator includes an address bit memory that couples between the read address bit input terminal and a first input terminal to a first logic gate. In addition, each one-bit comparator includes a first switch coupled between the read address bit input terminal and a second input terminal to the first logic gate. Finally, each one-bit comparator includes a second switch coupled between the write address bit input terminal and the second input terminal to the first logic gate.

Transmission gate 207 is controlled so as to conduct during a read address comparison operation and not conduct otherwise. Conversely, transmission gate 203 is controlled so as to conduct during a write address comparison and not conduct otherwise. In particular, each transmission gate includes an n-type metal-oxide-semiconductor (NMOS) pass transistor in parallel with a p-type metal-oxide-semiconductor (PMOS) pass transistor. A memory signal from clock circuit 155 such as a write multiplexer (wmux) signal that is asserted during a write operation may be used to drive a gate of the PMOS pass transistor in transmission gate 207 and to drive a gate of the NMOS pass transistor in transmission gate 203. Similarly, a complement (wmux_n) of the wmux signal may drive a gate of the NMOS pass transistor in transmission gate 207 and a gate of the PMOS pass transistor in transmission gate 203. Each multiplexer 209 thus functions to select for a read address bit during a read operation to provide a selected bit and to select for a write address bit during a write operation to provide the selected bit.

Since transmission gate 207 is conducting during the read address comparison whereas transmission gate 203 is conducting during the write address comparison, multiplexer 209 functions to time-division multiplex the read address bit and the write address bit to XOR gate 220. During the read operation, XOR gate 220 will thus compare the stored read address bit from master-slave latch 208 to the current read address bit. Similarly, XOR gate 220 compares the stored read address bit from master-slave latch 208 to the current write address bit during a write operation. There is thus an address comparison during the read operation in a given memory clock cycle and also an address comparison during the write operation in the same memory clock cycle.

The output signal from each XOR gate 220 will be a binary zero (discharged to ground in an active-high implementation) only when the stored address bit matches the current address bit. N-bit wide comparison signal 221 will thus be all zeroes if the current read or write operation is directed to the same bitcell group as was addressed in the preceding read operation. N-bit wide comparison signal 221 is thus an active-low signal that is asserted whenever the current read or write operation is directed to the same bitcell group as was addressed in the preceding read operation. In contrast, at least one of the bits in the N-bit wide comparison signal 221 will be charged to the memory power supply voltage if the current read or write operation is not directed to the same bitcell group that was addressed in the preceding read operation.

A plurality of OR gates 230 arranged in parallel process the N-bit wide comparison signal 221 formed by XOR gates 220. Each OR gate 230 ORs the output signals from a corresponding group of XOR gates 220. A final OR gate 230 also ORs an output signal burst_reset from a burst-mode blocking latch 245. Should burst-mode blocking latch 245 be set, the burst_reset signal has a binary one value. As will be explained further herein, this assertion of the burst_reset signal blocks the burst mode for a current read operation. But if burst-mode blocking latch 245 is reset, the burst_reset signal has a binary zero value that does not block the burst mode for a current read operation. Burst-mode blocking latch 245 is an example of a second storage element such as a set-reset latch configured to store the burst_reset signal.

Burst-mode blocking latch 245 is only set when a current write operation is directed to the same bitcell group as was addressed in the preceding read operation. Such a write operation is designated herein as an intervening write operation. Burst-mode blocking latch 245 is maintained in a reset state in the absence of this intervening write operation. If a current read operation is directed to the same bitcell group as was addressed in the preceding read operation and burst-mode blocking latch 245 is not set, the output signals from the OR gates 230 will all be binary zeroes. The outputs of the OR gates 230 are processed by a NOR gate 235 to form a burst-mode enable signal en_bst. The burst-mode enable signal en_bst thus will be asserted high (a binary one value) when a current read operation is to proceed as a burst-mode read operation and will be discharged (a binary zero value) if the current read operation is to proceed as a random read operation. In an alternative implementation, OR gates 230 may be replaced by a single OR gate that processes the outputs from XOR gates 220 and the burst_reset signal from burst-mode blocking latch 245. In such an implementation, NOR gate 235 may be replaced by an inverter to produce the burst-mode enable signal en_bst. OR gates 230 and NOR gate 235 may be collectively denoted herein as a combining circuit 222 configured to combine the n-bit wide comparison signal 221 into a combined output signal. The burst-mode enable signal en_bst is an example of the combined output signal from combining circuit 222. XOR gates 220 may each be denoted as a first logic gate.

The burst-mode enable signal en_bst drives a gate of an NMOS transistor M5 having a source connected to a drain of an NMOS transistor M7. The drain of transistor M7 connects to ground. An active-low write reset signal that is asserted during a write operation drives the gate of transistor M7. The active-low write reset signal is true (grounded) during a write operation and asserted to the power supply voltage during a read operation. The drain of transistor M5 will thus be grounded during a read operation in which the burst-mode enable signal en_bst is asserted. But during a write operation, even if the burst-mode enable signal en_bst is asserted due to an address comparison match, transistor M7 will be off to prevent transistor M5 from grounding its drain in response to the assertion of the burst-mode enable signal en_bst. Transistor M5 may also be denoted as a first transistor herein.

The drain of transistor M5 connects to a source of an NMOS transistor M6, which may also be denoted as a second transistor. Since memory clock signal 102 drives the gate of transistor M6, a drain of transistor M6 will be grounded in response to a rising edge of memory clock signal 102 when the burst-mode enable signal en_bst is asserted for a current read operation. The drain of transistor M6 is coupled to a node 145 for the active-low burst-mode signal. The burst-mode signal will thus be discharged to ground to signify that the burst mode is active if the burst-mode enable signal en_bst is asserted for a current read operation. A latch such as a pulsed latch 225 includes a pair of inverters configured to latch the burst-mode signal. Pulsed latch 225 includes a PMOS reset transistor P6 having a drain coupled to the drain of transistor M6 and a source coupled to the power supply voltage node. An active-low clock signal ready_pl that is asserted at a completion of a (random or burst mode) read operation by clock circuit 155 drives a gate of reset transistor P6. The active-low assertion of the burst-mode signal thus has a pulse width that is determined by its reset when reset transistor P6 switches on at the end of a read operation.

Node 145 for the burst-mode signal couples to a first input terminal of NAND gate 251 having a second input terminal coupled to a node for a memory clock signal (iclk). NAND gate 251 is thus part of clock circuit 155 (FIG. 1), which also includes a pulsed latch (not illustrated) for latching the iclk signal. This pulsed latch is set in response to a rising edge of memory clock signal 102 and reset at the completion of a read operation (random or burst mode). If the burst-mode enable signal en_bst is not asserted for a current read operation, the burst-mode signal is a binary one. In that case, the assertion of the iclk signal causes an output signal from NAND gate 251 to be a binary zero. This binary zero signal is inverted by an inverter 256 to form a word line clock signal (WL_clk). This word line clock signal is buffered to drive the word line. The word line will thus be asserted during a random read operation and also during a write operation. But if the burst-mode signal is discharged, the output of NAND gate 251 is a binary one such that the word line clock signal is a binary zero. The word line is thus blocked from being asserted during a burst-mode read operation.

A set logic gate such as an AND gate 255 has an output terminal coupled to a set terminal of burst-mode blocking latch 245. AND gate 255 ANDs a write clock signal (wclk) that is asserted during a write operation by clock circuit 155. In addition, AND gate 255 ANDs the burst-mode enable signal en_bst and a write enable signal that is asserted for cycles of memory clock signal 102 in which the write operation is active. Suppose that a current write operation is addressed to the same bitcell group as was addressed in a preceding read operation. The burst-mode enable signal en_bst, the write clock wclk and the write enable signal will thus all be true during such a write operation such that AND gate 255 sets burst-mode blocking latch 245 so that the burst_reset signal is asserted. In alternative implementations, other types of logic gates such as a NAND gate may be used to form the set logic gate. A reset logic gate such as another AND gate 250 has an output terminal coupled to a reset terminal of burst-mode blocking latch 245. AND gate 250 ANDs the ready_pl signal and a read signal that is asserted during a read operation. An output signal of AND gate 250 will thus be asserted at the end of a read operation. The read address comparison by burst-mode address comparator 200 for a read operation in a subsequent memory clock occurs during after completion of a write operation in a preceding memory clock cycle. Should burst-mode blocking latch 245 have been set, the binary one value of the burst_reset signal thus blocks burst-mode address comparator 200 from discharging the burst_n signal during the read address comparison. A current read operation will then proceed as a random read operation, whereupon the burst_reset signal is reset by the action of AND gate 250. In alternative implementations, other types of logic gates such as a NAND gate may be used to form the reset logic gate.

Figure 3:
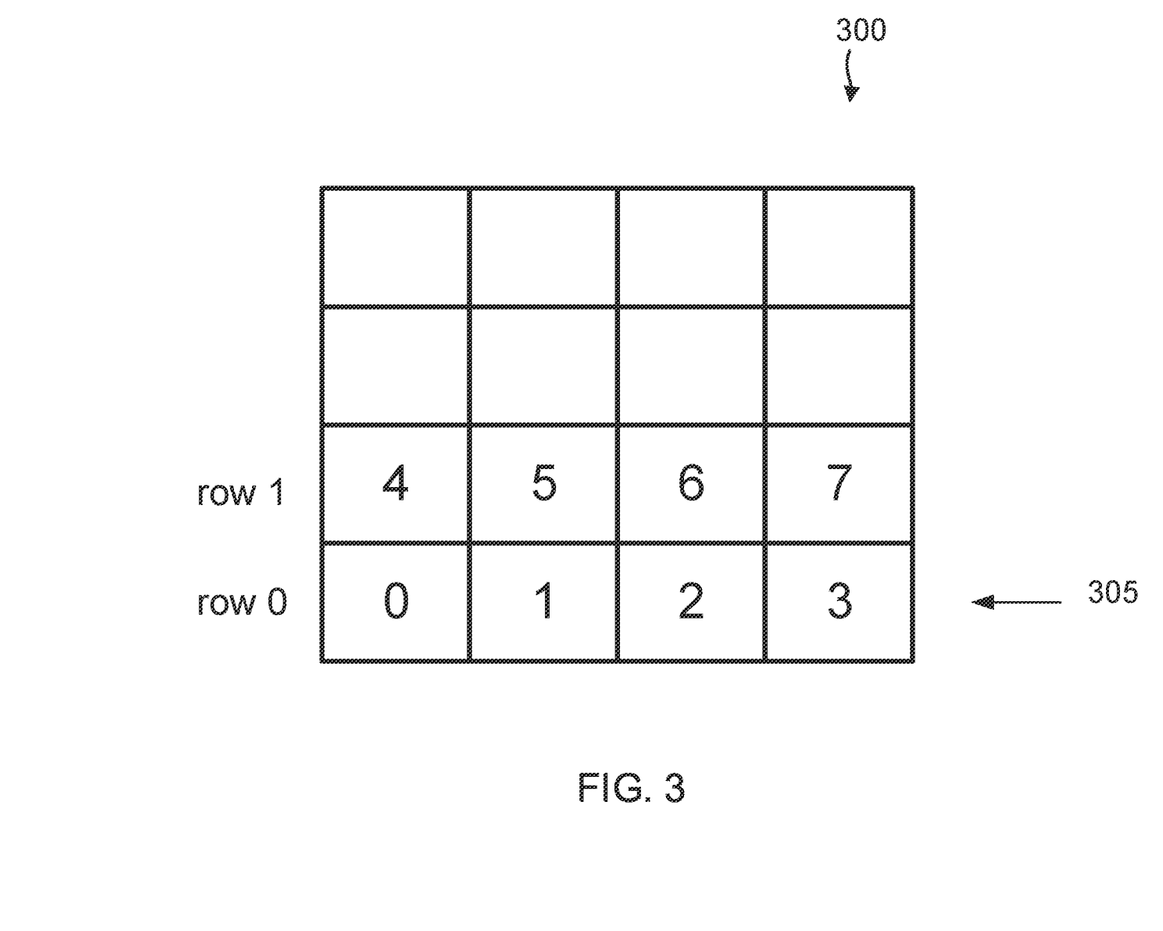
FIG. 3 illustrates an array of PDP bitcells including a bitcell group in accordance with an aspect of the disclosure.

The operation of burst-mode address comparator 200 will now be discussed with regard to an example array 300 of PDP bitcells shown in FIG. 3. Array 300 is a four-bit burst-mode PDP MUX4 array. A bitcell group 305 is formed in a row 0 by a group of four bitcells designated as bitcells 0 through 3. Since array 300 is a four-bit burst-mode PDP MUX4 array, there is a sense amplifier (not illustrated) for each bit in bitcell group 305. A row 1 of bitcells in array 300 includes four bitcells designated as bitcells 4 through 7.

Figure 4:
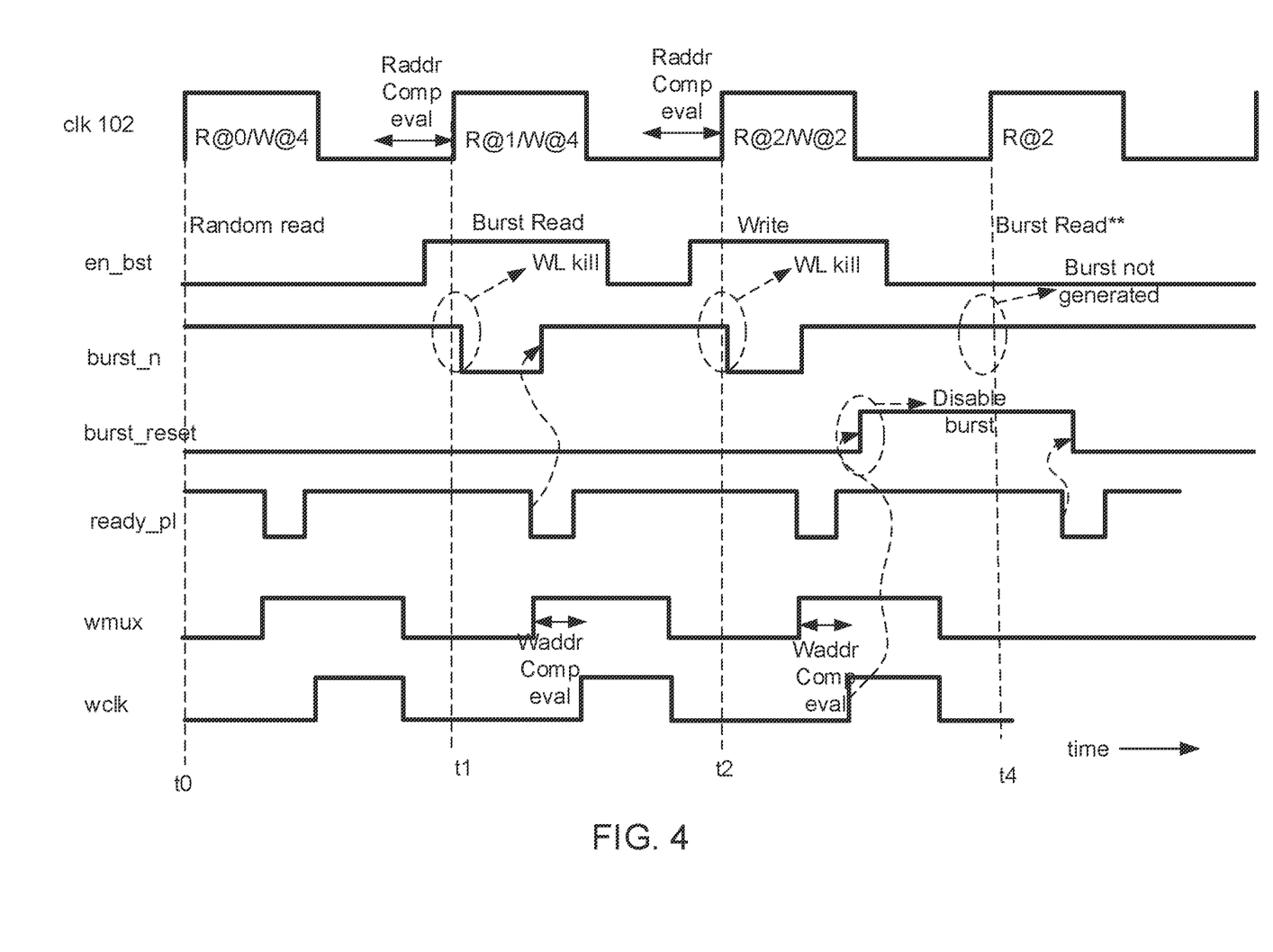
FIG. 4 is a timing diagram for various random and burst-mode reads for a PDP SRAM in accordance with an aspect of the disclosure.

Some operating waveforms for array 300 as controlled by burst-mode address comparator 200 are shown in FIG. 4. A first cycle of memory clock signal 102 begins at a time t0. The burst_n signal is asserted at time t0 so the ensuing read operation for the first memory clock cycle will be a random read operation. The read operation is directed to bitcell 0 in array 300 that is part of bitcell group 305. This read operation is thus designated as R@0. The burst_reset signal is discharged during this first cycle of memory clock signal 102. At the successful completion of the read operation, the active-low ready_pl signal is pulsed low. The wmux signal is then asserted for the write operation in the first memory clock cycle followed by the assertion of the write clock signal wclk. This write operation is directed to bitcell 4, which is not in bitcell group 305 and thus will not cause an assertion of the burst-enable signal en_bst. This write operation is designated as W@4.

In a final portion of the first memory clock cycle, a read address comparison occurs for a second read operation that will occur in a second cycle of memory clock signal 102. The read operation is directed to bitcell 1 and designated R@1. Since this read address is directed to the same bitcell group 305, burst-mode address comparator 200 asserts the burst-mode enable signal en_bst. The second memory clock cycle begins at a time t1. The assertion of the memory clock signal 102 in conjunction with the assertion of the burst-mode enable signal en_bst switches on both transistors M5 and M6 (FIG. 2) so that the burst_n signal is discharged. The read to bitcell 1 in the second memory clock cycle will thus occur as a burst-mode read operation so that the word line is not asserted (WL kill). At the completion of this burst-mode read operation, the ready_pl signal is pulsed low, which causes the burst_n signal to be charged back to the power supply voltage.

With the ready_pl signal pulsed low during the second memory clock cycle, the write address comparison (Waddr Comp eval) takes place in burst-mode address comparator 200. The second write operation (W@4) is again directed to bitcell 4 so the burst_reset signal stays low and the burst-mode enable signal en_bst is reset by being discharged. This second write operation is responsive to another pulsing of the wmux and write clock wckl signals.

In a final portion of the second memory clock cycle, a read address comparison (Raddr Comp eval) takes place for a third read operation that is directed to bitcell 2 (R@2). Since bitcell 2 is in the same bitcell group 305 as was addressed in the read operation in the second memory clock cycle, the burst-mode enable signal en_bst is asserted high. The memory clock signal 102 again pulses high at a time t2 to begin a third memory clock cycle. The assertion of the memory clock signal 102 in conjunction with the assertion of the burst-mode enable signal en_bst switches on both transistors M5 and M6 (FIG. 2) so that the burst_n signal is pulsed low. The read to bitcell 2 (R@2) will thus occur as a burst-mode read operation in the third memory clock cycle so that the word line is not asserted (WL kill). At the completion of this second burst-mode read operation, the ready_pl signal is pulsed low, which causes the burst_n signal to be charged back to the power supply voltage.

With the ready_pl signal pulsed low, the write address comparison (Waddr Comp eval) for the third memory clock cycle takes place in burst-mode address comparator 200. The third write operation (W@2) is now directed to bitcell 2, which is in bitcell group 305 that was addressed in the read operation to bitcell 1 in the preceding memory clock cycle. The burst-mode enable signal en_bst is thus asserted, which results in a setting of the burst_reset signal to disable the burst mode. A read operation (R@2) in a fourth memory clock cycle beginning at a time t4 thus occurs as a random read operation.

Figure 5:
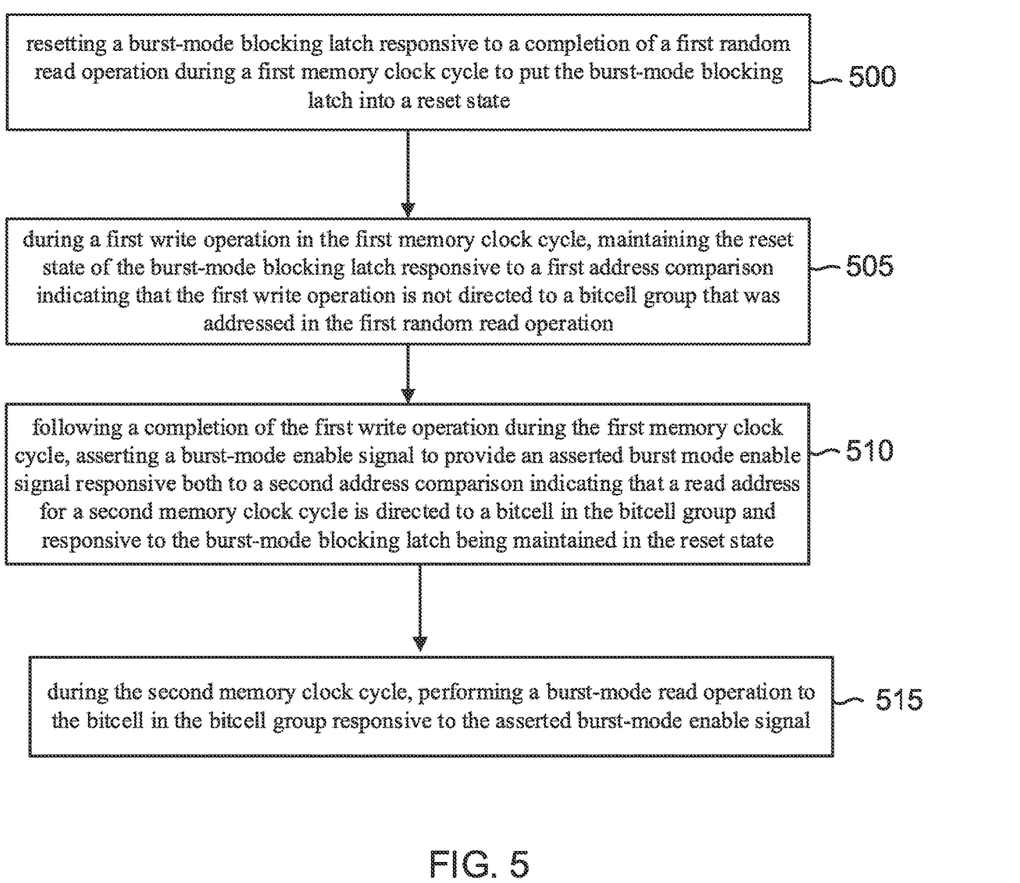
FIG. 5 is a flowchart of a PDP burst-mode address comparison method in accordance with an aspect of the disclosure.

A method of burst-mode address comparison for a PDP SRAM will now be discussed with regard to the flowchart of FIG. 5. The method includes an act 500 of resetting a burst-mode blocking latch responsive to a completion of a first random read operation during a first memory clock cycle to put the burst-mode blocking latch into a reset state. The resetting of burst-mode blocking latch 245 by AND gate 250 following the completion of each read operation (random or burst mode) is an example of act 500.

The method further includes an act 505 that occurs during a first write operation in the first memory clock cycle and includes maintaining the reset state of the burst-mode blocking latch responsive to a first address comparison indicating that the first write operation is not directed to a bitcell group that was addressed in the first random read operation. The operation of AND 255 in which the output of AND gate 255 is a binary zero because the burst-mode enable signal en_bst was not asserted during the write address comparison so as to not set burst-mode blocking latch 245 is an example of act 505.

The method further includes an act 510 that occurs following a completion of the first write operation during the first memory clock cycle and includes asserting a burst-mode enable signal to provide an asserted burst-mode enable signal responsive both to a second address comparison indicating that a read address for a second memory clock cycle is directed to a bitcell in the bitcell group and responsive to the burst-mode blocking latch being maintained in the reset state. The assertion of the burst-mode enable signal en_bst during a read address comparison in the absence of the burst-mode blocking latch 245 having been set is an example of act 510.

Finally, the method includes an act 515 that occurs during the second memory clock cycle and includes performing a burst-mode read operation to the bitcell in the bitcell group responsive to the asserted burst-mode enable signal. The burst-mode read operation discussed with regard to either the second or third memory clock cycles of FIG. 4 is an example of act 515.

Figure 6:
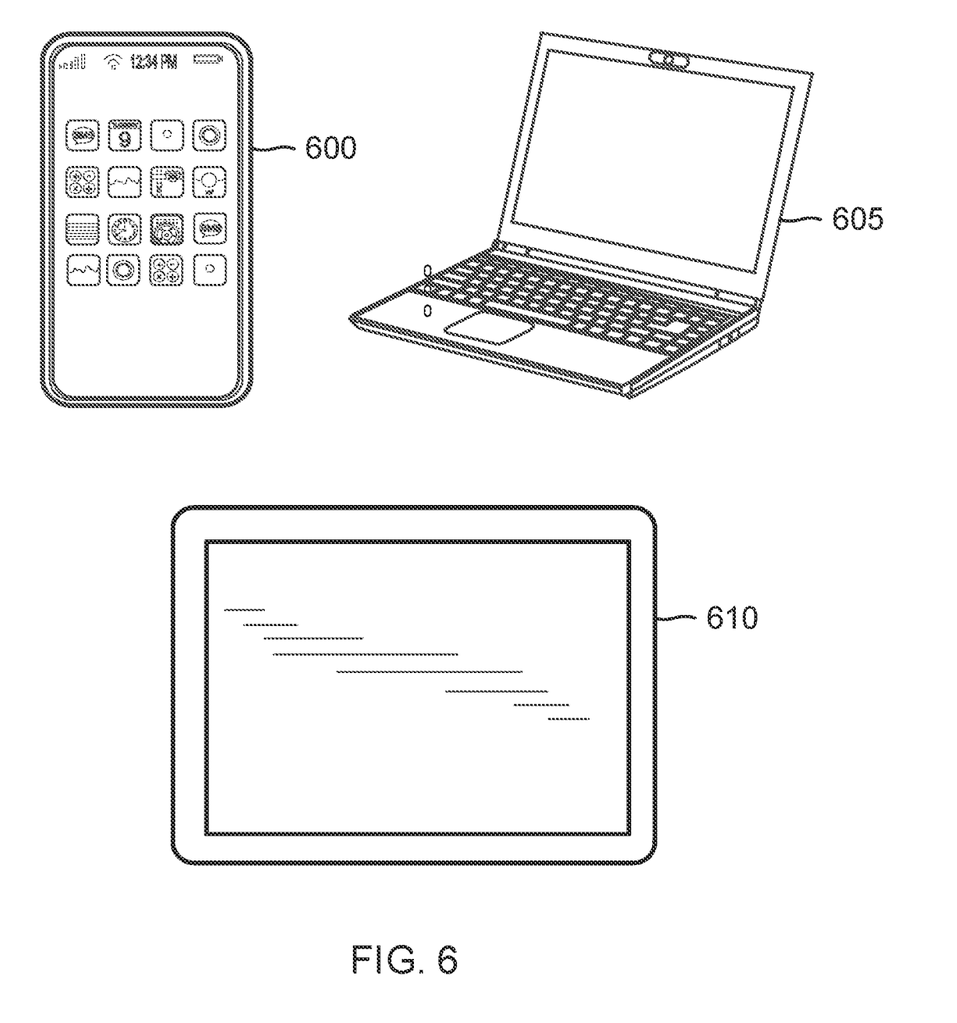
FIG. 6 illustrates some example electronic systems each incorporating a PDP SRAM with burst-mode address comparison in accordance with an aspect of the disclosure.

A PDP memory with burst-mode address comparison as disclosed herein may be incorporated into a wide variety of electronic systems. For example, as shown in FIG. 6, a cellular telephone 600, a laptop computer 605, and a tablet PC 610 may all include a PDP memory having a burst-mode address comparator in accordance with the disclosure. Other exemplary electronic systems such as a music player, a video player, a communication device, and a personal computer may also be configured with burst-mode address comparators constructed in accordance with the disclosure.

Some aspects of the disclosure will now be summarized in the following series of example clauses:

Clause 1. An address comparator for a memory, comprising:

a plurality of single-bit comparators, each single-bit comparator in the plurality of single-bit comparators including a multiplexer configured to select for a read address bit during a memory read operation to provide a selected bit and to select for a write address bit during a memory write operation to provide the selected bit and including a first logic gate configured to compare the selected bit to a stored address bit to provide an output signal; and a combining circuit configured to combine the output signal from each single-bit comparator in the plurality of single-bit comparators to form a combined output signal to control the memory read operation.

Clause 2. The address comparator of clause 1, wherein the multiplexer in each single-bit comparator comprises a first switch and a second switch.

Clause 3. The address comparator of clause 2, wherein each single-bit comparator in the plurality of single-bit comparators includes a first storage element configured to store the stored address bit.

Clause 4. The address comparator of clause 3, further comprising:

a node for a read control signal; and a first transistor coupled to the node for the read control signal and having a gate coupled to the combined output signal Clause 5. The address comparator of clause 4, further comprising:

a second storage element having an output terminal coupled to an input terminal of the combining circuit.

Clause 6. The address comparator of clause 5, wherein the second storage element comprises a set-reset latch, the address comparator further comprising:

a reset logic gate coupled to a reset terminal of the set-reset latch, the reset logic gate having a first input terminal coupled to a node for a clock signal and having a second input terminal coupled to a node for a read signal.

Clause 7. The address comparator of clause 6, further comprising a set logic gate coupled to a set terminal of the set-reset latch.

Clause 8. The address comparator of clause 7, wherein the set logic gate is an AND gate or a NAND gate having a first input terminal coupled to a node for a write operation clock signal and having a second input terminal coupled to the gate of the first transistor.

Clause 9. The address comparator of any of clauses 4-8, further comprising:

a latch configured to latch the read control signal, the latch including the node for the read control signal; and a reset transistor coupled between the node for the read control signal and a power supply node.

Clause 10. The address comparator of clause 4, further comprising a second transistor coupled between the first transistor and the node for the read control signal, wherein a gate of the second transistor is coupled to a node for a memory clock signal.

Clause 11. The address comparator of clause 10, wherein the first transistor and the second transistor each comprise an n-type metal-oxide-semiconductor (NMOS) transistor.

Clause 12. The address comparator of any of clauses 4-11, wherein the memory comprises:

a word line; and a word line driver configured to drive the word line, wherein the node for the read control signal is coupled to an input terminal of the word line driver.

Clause 13. The address comparator of clause 12, wherein the word line driver is configured to assert a voltage of the word line during a random read operation responsive to a de-assertion of the read control signal and to not assert the voltage of the word line during a burst-mode read operation responsive to an assertion of the read control signal.

Clause 14. The address comparator of clause 12, wherein the memory further comprises:

a first column including a pair of bit lines;

a pair of charge-transfer transistors coupled to the pair of bit lines;

a sense amplifier coupled to the pair of charge-transfer transistors through a pair of sense nodes;

a first sense node transistor coupled between ground and a first sense node in the pair of sense nodes;

a second sense node transistor coupled between ground and a second sense node in the pair of sense nodes; and a clock circuit having an output terminal coupled to a gate of the first sense node transistor and the second sense node transistor.

Clause 15. The address comparator of clause 14, wherein the clock circuit is further configured to assert its output terminal responsive to the control signal during a random read operation and to discharge its output terminal responsive to the control signal during a burst-mode read operation.

Clause 16. The address comparator of clause 14, wherein the sense amplifier comprises a pair of cross-coupled NAND gates.

Clause 17. A method of a burst-mode address comparison for a pseudo-dual-port memory, comprising:

resetting a latch responsive to a completion of a first random read operation during a first memory clock cycle to put the latch into a reset state;

during a first write operation in the first memory clock cycle, maintaining the reset state of the latch responsive to a first address comparison indicating that the first write operation is not directed to a bitcell group that was addressed in the first random read operation;

following a completion of the first write operation during the first memory clock cycle, asserting a burst-mode enable signal to provide an asserted burst-mode enable signal responsive both to a second address comparison indicating that a read address for a second memory clock cycle is directed to a bitcell in the bitcell group and responsive to the latch being maintained in the reset state; and during the second memory clock cycle, performing a burst-mode read operation to the bitcell in the bitcell group responsive to the asserted burst-mode enable signal.

Clause 18. The method of clause 17, further comprising:

during a second write operation in the second memory clock cycle, setting the latch responsive to a third address comparison indicating that the second write operation is directed to the bitcell group that was addressed in the first random read operation; and writing to a second bitcell in the bitcell group during the second memory clock cycle.

Clause 19. The method of clause 18, further comprising:

performing a second random read operation to the pseudo-dual-port memory during a third memory clock cycle responsive to the setting of the burst-mode blocking latch.

Clause 20. An address comparator for memory, comprising:
a plurality of one-bit address comparators having a plurality of output terminals, each one-bit address comparator in the plurality of one-bit address comparators including a multiplexer coupled to a respective read address input terminal and to a respective write address input terminal; and
a combining circuit configured to combine an output signal from each single-bit comparator in the plurality of single-bit comparators to form a combined output signal on a combined output signal terminal.

Clause 21. The address comparator of clause 20, further comprising:
a first latch including a node for a control signal;
a first transistor coupled to the node for the control signal, wherein the combined output signal terminal is coupled to a gate of the first transistor.

Clause 22. The address comparator of clause 21, wherein each multiplexer comprises a pair of transmission gates, the address comparator further comprising:
a clock circuit having an output terminal coupled to a gate of a transistor in each transmission gate in each pair of transmission gates.

Clause 23. The address comparator of clause 22, wherein the clock circuit includes an input terminal coupled to the node for the control signal.

Clause 24. The address comparator of any of clauses 20-23, wherein the address comparator is included in a cellular telephone.

Clause 25. An address comparator for a pseudo-dual-port memory, comprising:
an address memory configured to store an address for a bitcell group to provide a stored address;
an address multiplexer configured to select to select between a read address for a read operation and a write address for a write operation to provide a selected address;
a plurality of first logic gates configured to assert a bit comparison signal responsive to the selected address being equal to the stored address;
a first latch configured to assert a burst-mode signal responsive to an assertion of the bit comparison signal while a burst reset signal is in a reset state; and
a second latch configured to set the burst reset signal responsive to an assertion of the bit comparison signal during the write operation and to reset the burst reset signal into the reset state after a completion of the read operation.

Clause 26. The address comparator of clause 25, wherein the pseudo-dual-port memory comprises:
a word line;
a plurality of columns, each column in the plurality of columns including a respective bitcell from the bitcell group at an intersection of the column with the word line, a pair of bit lines, and a sense amplifier coupled to the pair of bit lines through a pair of sense nodes; and a clock circuit configured to assert a voltage of the word line during the read operation responsive to the burst-mode signal not being asserted and to not assert the voltage of the word line during the read operation responsive to the burst-mode signal being asserted.

Clause 27. The address comparator of clause 26, wherein the pseudo-dual-port memory further comprises:
a sense node pre-charge circuit configured to pre-charge each pair of sense nodes during the read operation responsive to a sense node pre-charge signal being asserted and to not pre-charge each pair of sense nodes during the read operation responsive to the sense node pre-charge signal not being asserted, wherein the clock circuit is further configured to assert the sense node pre-charge signal during the read operation responsive to the burst-mode signal not being asserted and to not assert the sense node pre-charge signal during the read operation responsive to the burst-mode signal being asserted.

Clause 28. The address comparator of any of clauses 25-27, wherein each first logic gate in the plurality of first logic gates is an XOR gate.

Clause 29. The address comparator of any of clauses 25-28, wherein the address multiplexer comprises a plurality of transmission gates.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. An address comparator for a memory, comprising:
a plurality of single-bit comparators, each single-bit comparator in the plurality of single-bit comparators including a multiplexer configured to select for a read address bit during a memory read operation to provide a selected bit and to select for a write address bit during a memory write operation to provide the selected bit and including a first logic gate configured to compare the selected bit to a stored address bit to provide an output signal; and
a combining circuit configured to combine the output signal from each single-bit comparator in the plurality of single-bit comparators to form a combined output signal to control the memory read operation.

2. The address comparator of claim 1, wherein the multiplexer in each single-bit comparator comprises a first switch and a second switch.

3. The address comparator of claim 1, wherein each single-bit comparator in the plurality of single-bit comparators includes a first storage element configured to store the stored address bit.

4. The address comparator of claim 1, further comprising:
a node for a read control signal; and
a first transistor coupled to the node for the read control signal and having a gate coupled to the combined output signal.

5. The address comparator of claim 4, further comprising:
a second storage element having an output terminal coupled to an input terminal of the combining circuit.

6. The address comparator of claim 5, wherein the second storage element comprises a set-reset latch, the address comparator further comprising:
a reset logic gate coupled to a reset terminal of the set-reset latch, the reset logic gate having a first input terminal coupled to a node for a clock signal and having a second input terminal coupled to a node for a read signal.

7. The address comparator of claim 6, further comprising a set logic gate coupled to a set terminal of the set-reset latch, the set logic gate having a first input terminal coupled to a node for a write operation clock signal and having a second input terminal coupled to the gate of the first transistor.

8. The address comparator of claim 7, wherein the set logic gate is an AND gate or a NAND gate having a first input terminal coupled to a node for a write operation clock signal and having a second input terminal coupled to the gate of the first transistor.

9. The address comparator of claim 4, further comprising:
a latch configured to latch the read control signal, the latch including the node for the read control signal; and
a reset transistor coupled between the node for the read control signal and a power supply node.

10. The address comparator of claim 4, further comprising a second transistor coupled between the first transistor and the node for the read control signal, wherein a gate of the second transistor is coupled to a node for a memory clock signal, and wherein each first logic gate is an XOR gate or an XNOR gate.

11. The address comparator of claim 10, wherein the first transistor and the second transistor each comprises an n-type metal-oxide-semiconductor (NMOS) transistor.

12. The address comparator of claim 4, wherein the memory comprises:
a word line; and
a word line driver configured to drive the word line, wherein the node for the read control signal is coupled to an input terminal of the word line driver.

13. The address comparator of claim 12, wherein the word line driver is configured to assert a voltage of the word line during a random read operation responsive to a de-assertion of the read control signal and to not assert the voltage of the word line during a burst-mode read operation responsive to an assertion of the read control signal.

14. The address comparator of claim 12, wherein the memory further comprises:
a first column including a pair of bit lines;
a pair of charge-transfer transistors coupled to the pair of bit lines;
a sense amplifier coupled to the pair of charge-transfer transistors through a pair of sense nodes;
a first sense node transistor coupled between ground and a first sense node in the pair of sense nodes;
a second sense node transistor coupled between ground and a second sense node in the pair of sense nodes; and
a clock circuit having an output terminal coupled to a gate of the first sense node transistor and the second sense node transistor.

15. The address comparator of claim 14, wherein the clock circuit is further configured to assert its output terminal responsive to the control signal during a random read operation and to discharge its output terminal responsive to the control signal during a burst-mode read operation.

16. The address comparator of claim 14, wherein the sense amplifier comprises a pair of cross-coupled NAND gates.

17. A method of a burst-mode address comparison for a pseudo-dual-port memory, comprising:
resetting a latch responsive to a completion of a first random read operation during a first memory clock cycle to put the latch into a reset state;
during a first write operation in the first memory clock cycle, maintaining the reset state of the latch responsive to a first address comparison indicating that the first write operation is not directed to a bitcell group that was addressed in the first random read operation;
following a completion of the first write operation during the first memory clock cycle, asserting a burst-mode enable signal to provide an asserted burst-mode enable signal responsive both to a second address comparison indicating that a read address for a second memory clock cycle is directed to a bitcell in the bitcell group and responsive to the latch being maintained in the reset state; and
during the second memory clock cycle, performing a burst-mode read operation to the bitcell in the bitcell group responsive to the asserted burst-mode enable signal.

18. The method of claim 17, further comprising:
during a second write operation in the second memory clock cycle, setting the latch responsive to a third address comparison indicating that the second write operation is directed to the bitcell group that was addressed in the first random read operation; and
writing to a second bitcell in the bitcell group during the second memory clock cycle.

19. The method of claim 18, further comprising:
performing a second random read operation to the pseudo-dual-port memory during a third memory clock cycle responsive to the setting of the latch.

20. An address comparator for memory, comprising:
a plurality of one-bit address comparators having a plurality of output terminals, each one-bit address comparator in the plurality of one-bit address comparators including a multiplexer coupled to a respective read address input terminal and to a respective write address input terminal; and
a combining circuit configured to combine an output signal from each single-bit comparator in the plurality of single-bit comparators to form a combined output signal on a combined output signal terminal.

21. The address comparator of claim 20, further comprising:
a first latch including a node for a control signal;
a first transistor coupled to the node for the control signal, wherein the combined output signal terminal is coupled to a gate of the first transistor.

22. The address comparator of claim 21, wherein each multiplexer comprises a pair of transmission gates, the address comparator further comprising:
a clock circuit having an output terminal coupled to a gate of a transistor in each transmission gate in each pair of transmission gates.

23. The address comparator of claim 22, wherein the clock circuit includes an input terminal coupled to the node for the control signal.

24. The address comparator of claim 20, wherein the address comparator is included in a cellular telephone.

25. An address comparator for a pseudo-dual-port memory, comprising:
an address memory configured to store an address for a bitcell group to provide a stored address;
an address multiplexer configured to select between a read address for a read operation and a write address for a write operation to provide a selected address;
a plurality of first logic gates configured to assert a bit comparison signal responsive to the selected address being equal to the stored address;
a first latch configured to assert a burst-mode signal responsive to an assertion of the bit comparison signal while a burst reset signal is in a reset state; and
a second latch configured to set the burst reset signal responsive to an assertion of the bit comparison signal during the write operation and to reset the burst reset signal into the reset state after a completion of the read operation.

26. The address comparator of claim 25, wherein the pseudo-dual-port memory comprises:

a word line;

a plurality of columns, each column in the plurality of columns including a respective bitcell from the bitcell group at an intersection of the column with the word line, a pair of bit lines, and a sense amplifier coupled to the pair of bit lines through a pair of sense nodes; and a clock circuit configured to assert a voltage of the word line during the read operation responsive to the burst-mode signal not being asserted and to not assert the voltage of the word line during the read operation responsive to the burst-mode signal being asserted.

27. The address comparator of claim 26, wherein the pseudo-dual-port memory further comprises:

a sense node pre-charge circuit configured to pre-charge each pair of sense nodes during the read operation responsive to a sense node pre-charge signal being asserted and to not pre-charge each pair of sense nodes during the read operation responsive to the sense node pre-charge signal not being asserted, wherein the clock circuit is further configured to assert the sense node pre-charge signal during the read operation responsive to the burst-mode signal not being asserted and to not assert the sense node pre-charge signal during the read operation responsive to the burst-mode signal being asserted.

28. The address comparator of claim 25, wherein each first logic gate in the plurality of first logic gates is an XOR gate.

29. The address comparator of claim 25, wherein the address multiplexer comprises a plurality of transmission gates.

* * * * *